(12) United States Patent
Huang et al.

(10) Patent No.: US 11,075,079 B2
(45) Date of Patent: Jul. 27, 2021

(54) DIRECTIONAL DEPOSITION FOR SEMICONDUCTOR FABRICATION

(71) Applicant: Taiwan Semiconductor Manufacturing Co., Ltd., Hsin-Chu (TW)

(72) Inventors: Shih-Chun Huang, Hsinchu (TW); Ya-Wen Yeh, Taipei (TW); Chien Wen Lai, Hsinchu (TW); Wei-Liang Lin, Hsin-Chu (TW); Ya Hui Chang, Hsinchu (TW); Yung-Sung Yen, New Taipei (TW); Ru-Gun Liu, Hsinchu County (TW); Chin-Hsiang Lin, Hsin-Chu (TW); Yu-Tien Shen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/107,699

(22) Filed: Aug. 21, 2018

(65) Prior Publication Data
US 2019/0157084 A1 May 23, 2019

Related U.S. Application Data

(60) Provisional application No. 62/589,257, filed on Nov. 21, 2017.

(51) Int. Cl.
*H01L 21/033* (2006.01)
*H01L 21/02* (2006.01)
*H01L 21/3205* (2006.01)
*H01L 21/308* (2006.01)
*H01L 21/266* (2006.01)
*C23C 16/458* (2006.01)
*C23C 16/50* (2006.01)
*C23C 16/04* (2006.01)

(52) U.S. Cl.
CPC ........ *H01L 21/0337* (2013.01); *C23C 16/042* (2013.01); *C23C 16/4582* (2013.01); *C23C 16/50* (2013.01); *H01L 21/02274* (2013.01); *H01L 21/266* (2013.01); *H01L 21/3086* (2013.01); *H01L 21/32051* (2013.01)

(58) Field of Classification Search
None
See application file for complete search history.

(56) References Cited

U.S. PATENT DOCUMENTS

| 6,316,169 | B1 * | 11/2001 | Vahedi | H01L 21/0274 216/37 |
| 8,728,332 | B2 | 5/2014 | Lin et al. | |
| 8,796,666 | B1 | 8/2014 | Huang et al. | |
| 8,822,243 | B2 | 9/2014 | Yan et al. | |
| 8,987,142 | B2 | 3/2015 | Lee et al. | |
| 9,093,530 | B2 | 4/2015 | Huang et al. | |
| 9,053,279 | B2 | 6/2015 | Chang et al. | |

(Continued)

*Primary Examiner* — Khaja Ahmad
(74) *Attorney, Agent, or Firm* — Haynes and Boone, LLP

(57) ABSTRACT

A method of depositing a material on one of two, but not both, sidewalls of a raised structure formed on a substrate includes tilting a normal of the substrate away from a source of the deposition material or tilting the source of the deposition material away from the normal of the substrate. The method may be implemented by a plasma-enhanced chemical vapor deposition (PECVD) technique.

20 Claims, 13 Drawing Sheets

(56) References Cited

U.S. PATENT DOCUMENTS

| | | | |
|---|---|---|---|
| 9,099,530 B2 | 8/2015 | Lin et al. | |
| 9,153,478 B2 | 10/2015 | Liu et al. | |
| 9,501,601 B2 | 11/2016 | Chang et al. | |
| 9,548,303 B2 | 1/2017 | Lee et al. | |
| 9,741,716 B1* | 8/2017 | Cheng | H01L 27/0886 |
| 9,773,643 B1* | 9/2017 | Singhal | C23C 16/4554 |
| 2005/0016462 A1* | 1/2005 | Yamazaki | H05B 33/10 |
| | | | 118/726 |
| 2007/0116986 A1* | 5/2007 | Garg | C03C 17/245 |
| | | | 428/701 |
| 2009/0017629 A1* | 1/2009 | Jang | H01L 21/76897 |
| | | | 438/700 |
| 2010/0040859 A1* | 2/2010 | Chang | C23C 14/086 |
| | | | 428/304.4 |
| 2012/0190203 A1* | 7/2012 | Yang | H01L 21/02274 |
| | | | 438/700 |
| 2013/0295716 A1* | 11/2013 | Kawato | H01L 51/0008 |
| | | | 438/99 |
| 2014/0272193 A1* | 9/2014 | Lin | H01J 37/32669 |
| | | | 427/569 |
| 2014/0291761 A1* | 10/2014 | Cheng | H01L 29/6656 |
| | | | 257/347 |
| 2014/0295674 A1* | 10/2014 | Cheng | C23C 14/221 |
| | | | 438/766 |
| 2014/0363678 A1* | 12/2014 | Kirkpatrick | G02B 1/02 |
| | | | 428/408 |
| 2015/0243518 A1* | 8/2015 | deVilliers | H01L 21/3212 |
| | | | 438/692 |
| 2017/0330753 A1* | 11/2017 | Bergendahl | H01L 29/66795 |
| 2018/0005898 A1* | 1/2018 | Cheng | H01L 27/0886 |
| 2018/0076035 A1* | 3/2018 | Bergendahl | H01L 21/0337 |

* cited by examiner

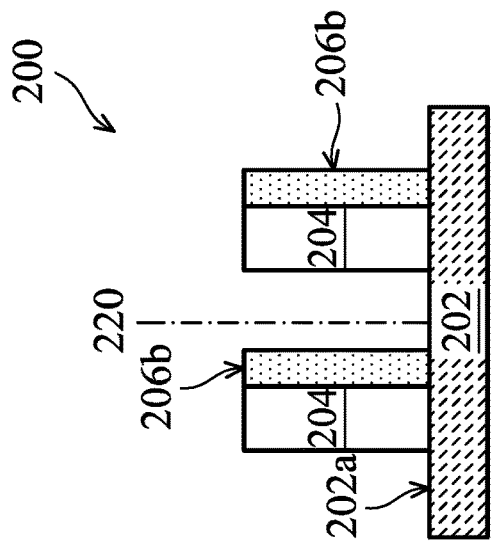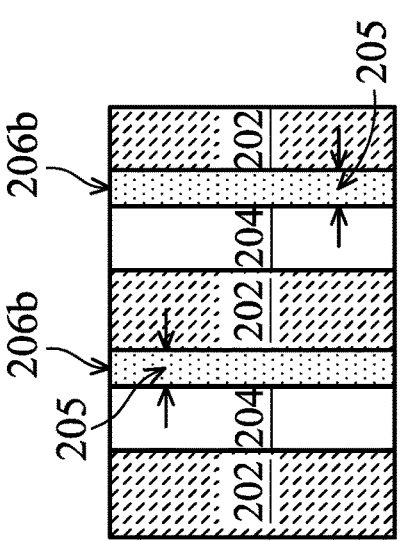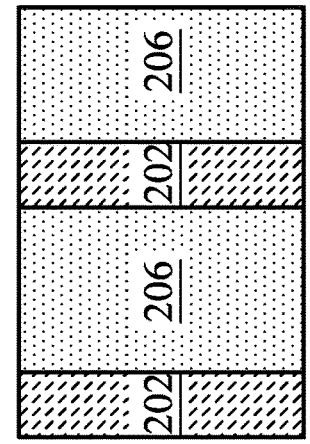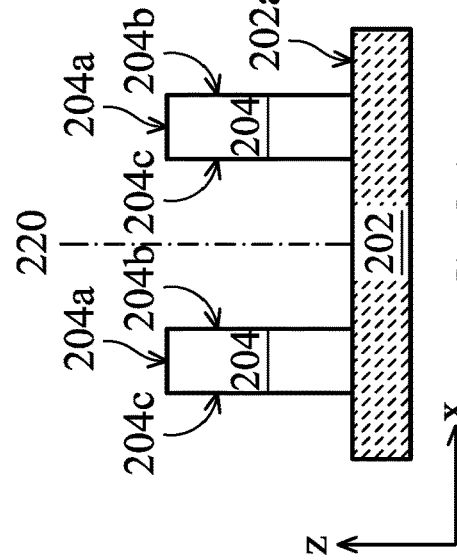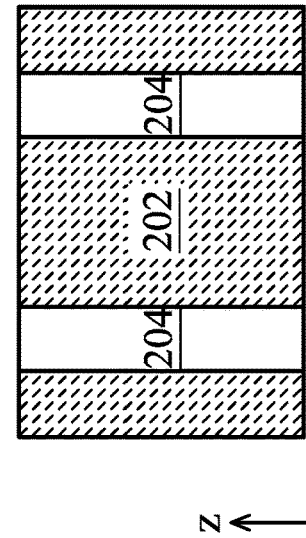

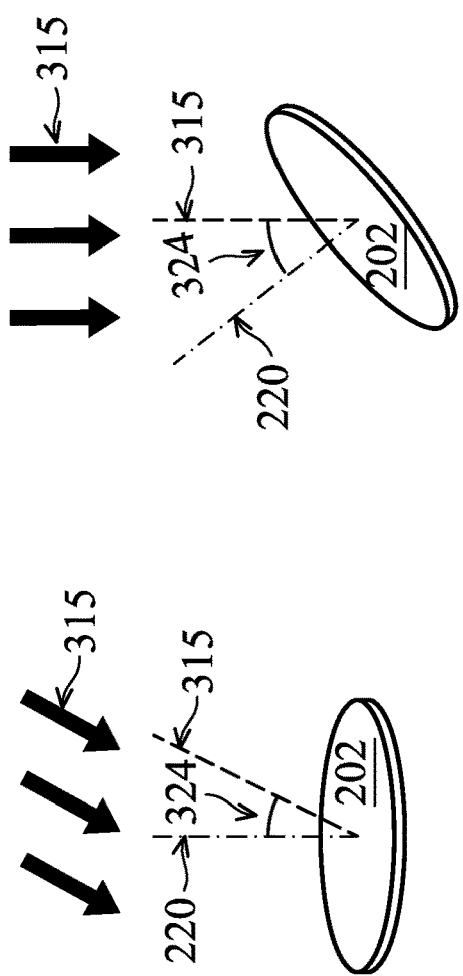
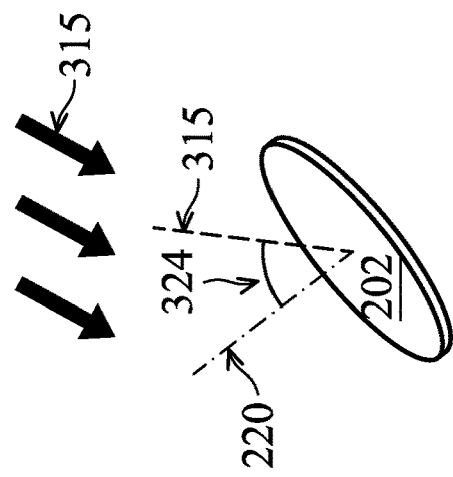
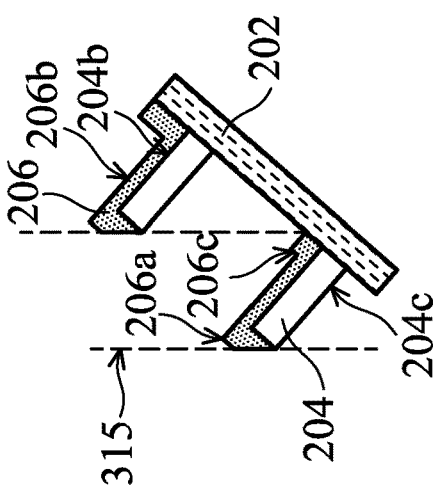
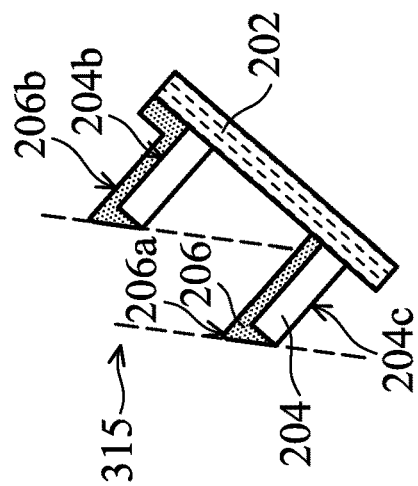
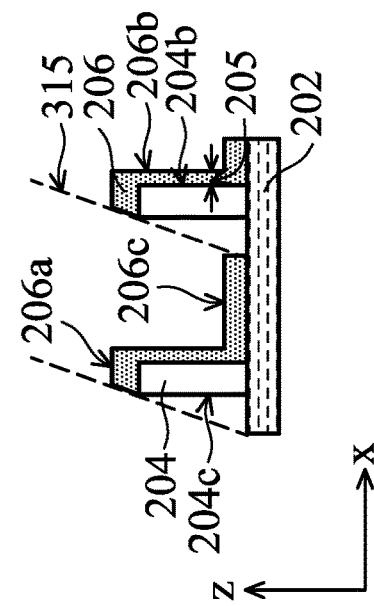
FIG. 6A  FIG. 7A  FIG. 8A
FIG. 6B  FIG. 7B  FIG. 8B

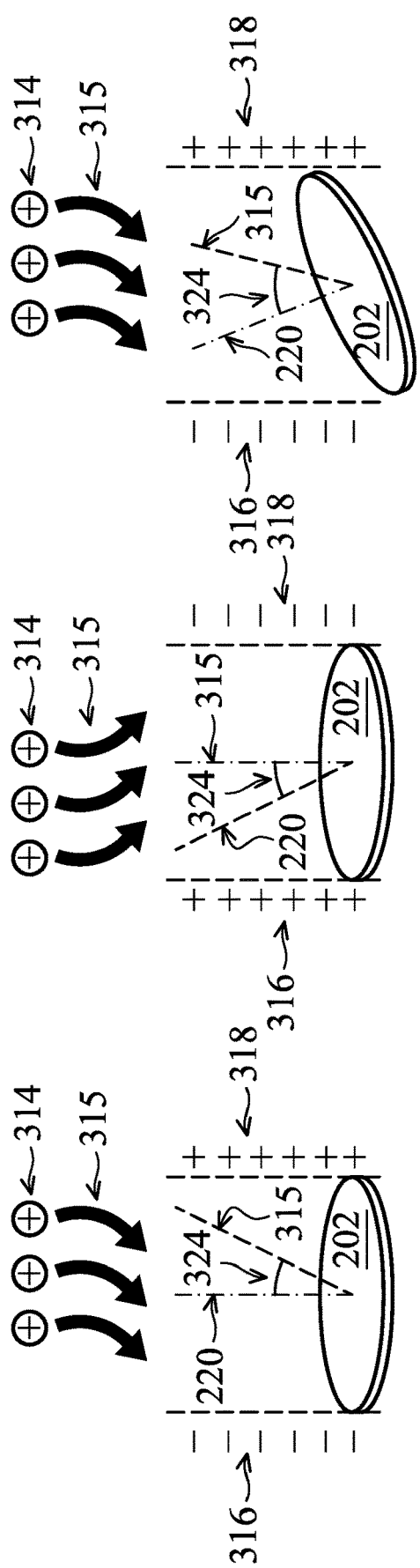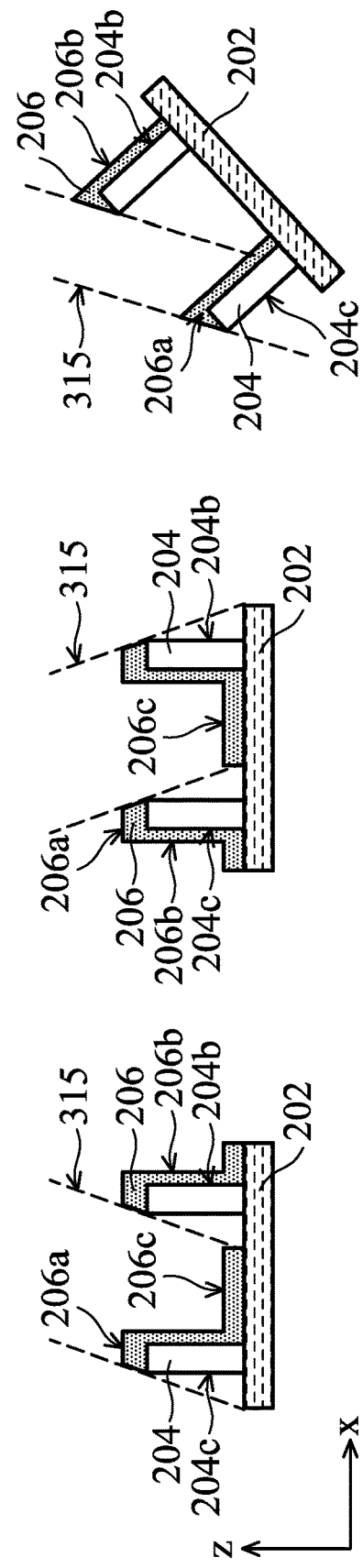

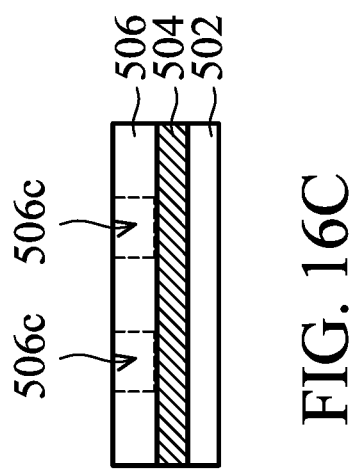
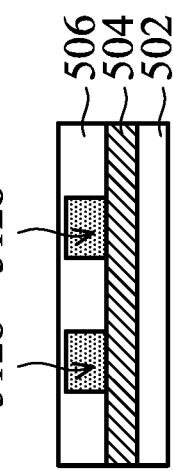
FIG. 16C
FIG. 16D
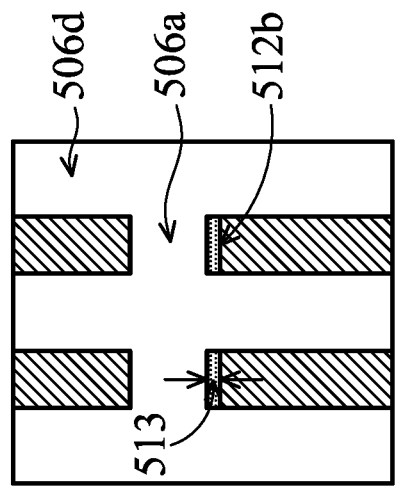
FIG. 16B
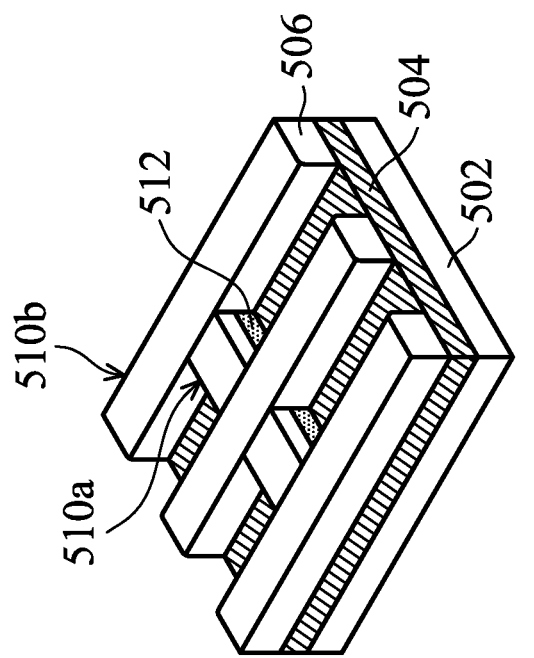
FIG. 16A

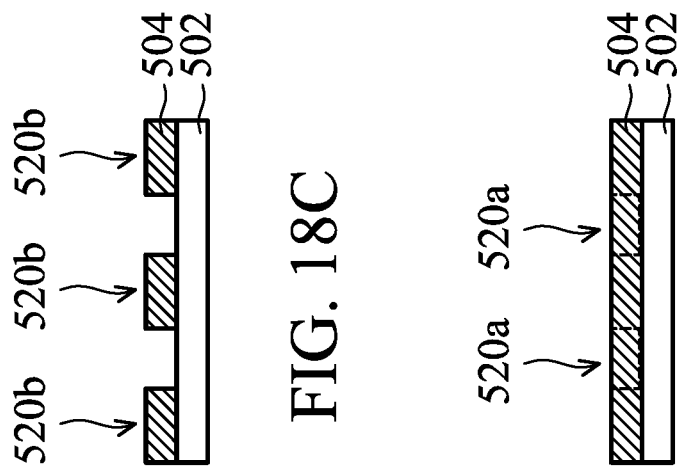
FIG. 18C
FIG. 18D
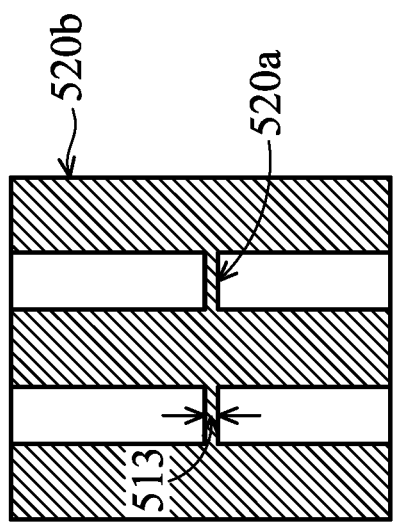
FIG. 18B
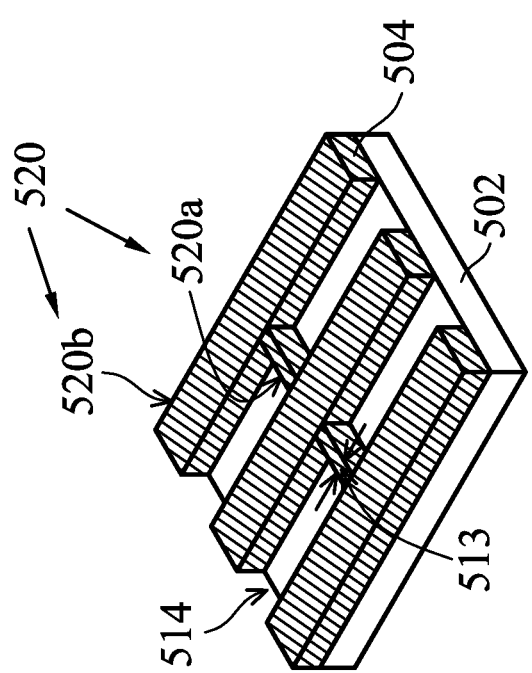
FIG. 18A

DIRECTIONAL DEPOSITION FOR SEMICONDUCTOR FABRICATION

This application claims priority to U.S. Provisional Patent Application Ser. No. 62/589,257 filed on Nov. 21, 2017, the entire disclosure is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As dimensions of semiconductor structures decrease, complexity and cost associated with implementing successive deposition and etching processes inevitably increase. Accordingly, improvements that would simplify these fabrication processes are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 3A, and 4A are side views of a portion of a semiconductor device in intermediate stages of an embodiment of the fabrication method of FIG. 1 according to some aspects of the present disclosure.

FIGS. 2B, 3B, and 4B are top views of the portion of the semiconductor device corresponding to FIGS. 2A, 3A, and 4A, respectively, according to some aspects of the present disclosure.

FIGS. 6A, 7A, 8A, 9A, 10A, and 11A are schematic views of a portion of a fabrication apparatus in an intermediate stage of an embodiment of the fabrication method of FIG. 1 according to some aspects of the present disclosure.

FIGS. 6B, 7B, 8B, 9B, 10B, and 11B are side views of the portion of the semiconductor device corresponding to FIGS. 6A, 7A, 8A, 9A, 10A, and 11A, respectively, according to some aspects of the present disclosure.

FIGS. 13A, 14A, 15A, 16A, 17A, 18A, and 19 are perspective views of a portion of a semiconductor device in intermediate stages of fabrication according to an embodiment of the fabrication method of FIG. 12.

FIGS. 13B, 14B, 15B, 16B, 17B, and 18B are top views of the portion of the semiconductor device corresponding to FIGS. 13A, 14A, 15A, 16A, 17A, and 18A, respectively, according to some aspects of the present disclosure.

FIGS. 13C, 14C, 15C, 16C, 17C, and 18C are cross-sectional views of the portion of the semiconductor device corresponding to FIGS. 13A, 14A, 15A, 16A, 17A, and 18A, respectively, taken along the line CC', according to some aspects of the present disclosure.

FIGS. 13D, 14D, 15D, 16D, 17D, and 18D are cross-sectional views of the portion of the semiconductor device corresponding to FIGS. 13A, 14A, 15A, 16A, 17A, and 18A, respectively, taken along the line DD', according to some aspects of the present disclosure.

DETAILED DESCRIPTION

Figure 1:
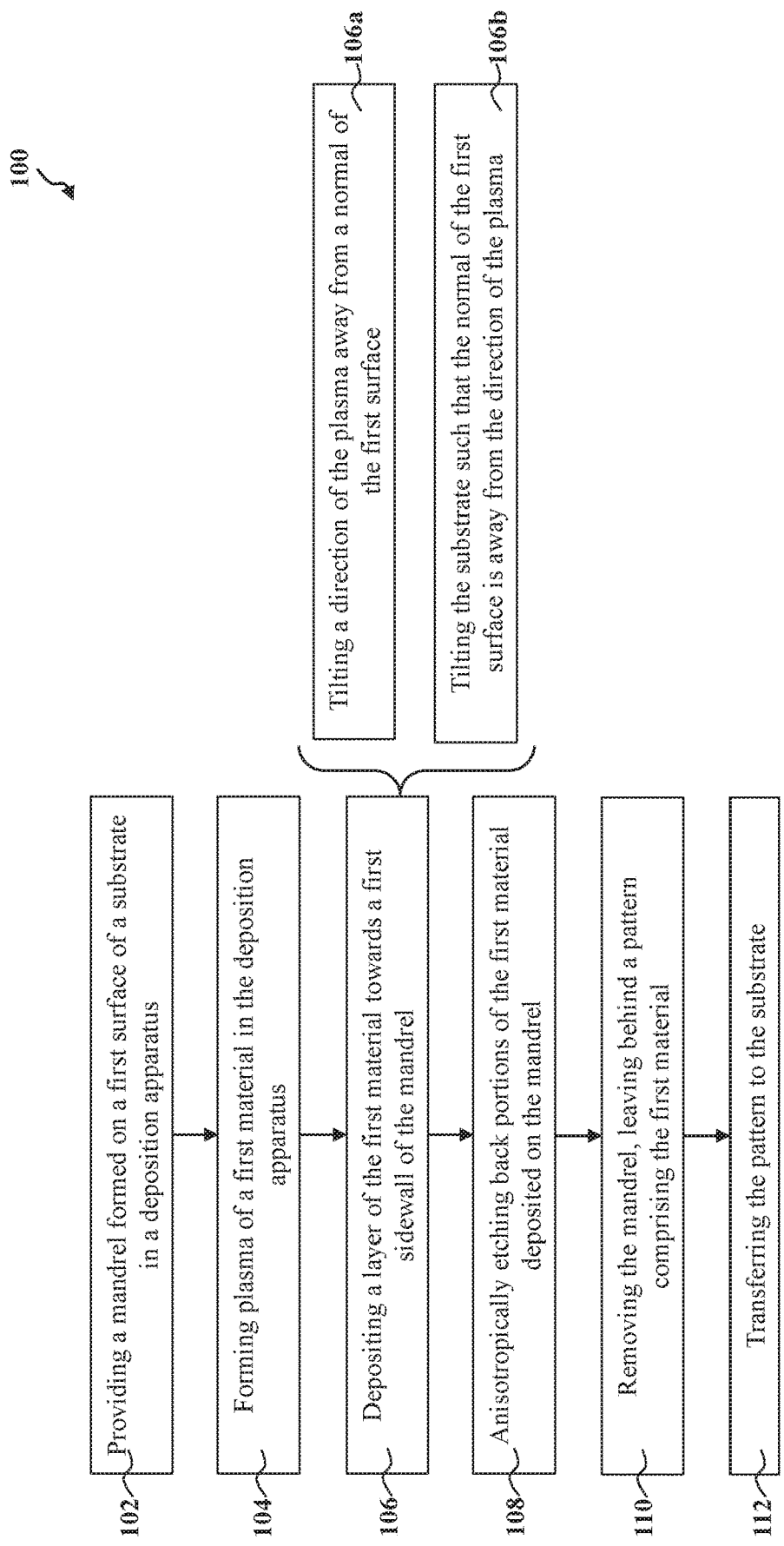
FIG. 1 is a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and methods of forming the same. More particularly, the present disclosure is related to methods of selective deposition on semiconductor structures. An object of the present disclosure is to deposit a material on one of two sidewalls (but not both) of a mandrel formed on a substrate by positioning the substrate at an angle with a source of the material during deposition. According to some aspects of the present disclosure, the deposition is implemented in a plasma-enhanced chemical vapor deposition (PECVD) apparatus. Some methods of forming structures (e.g., spacers) on only one sidewall of a mandrel include depositing a layer of spacer material over every sidewall of the mandrel and then removing (e.g., by etching) the spacer material on all sidewalls except one. However, as sizes of semiconductor structures continue to decrease, implementing such successive deposition and etching processes poses challenges to device fabrication. Accordingly, the present disclosure contemplates methods of deposition on selective surfaces of a semiconductor structure in order to reduce processing complexity.

FIG. 1 shows a flow chart of a method 100 for forming a structure (or device) 200 in one or more embodiments, according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. Intermediate stages of the method 100 are described below in conjunction with FIGS. 2A-11B. Of which, FIGS. 2A, 3A, 4A, 6B, 7B, 8B, 9B, 10B, and 11B are side views (in the x-z plane as labeled therein), and FIGS. 2B, 3B, and 4B are top views (in the x-y plane as labeled therein) of the structure 200 in intermediate stages of fabrication according to some embodiments of the method 100.

Figure 5:
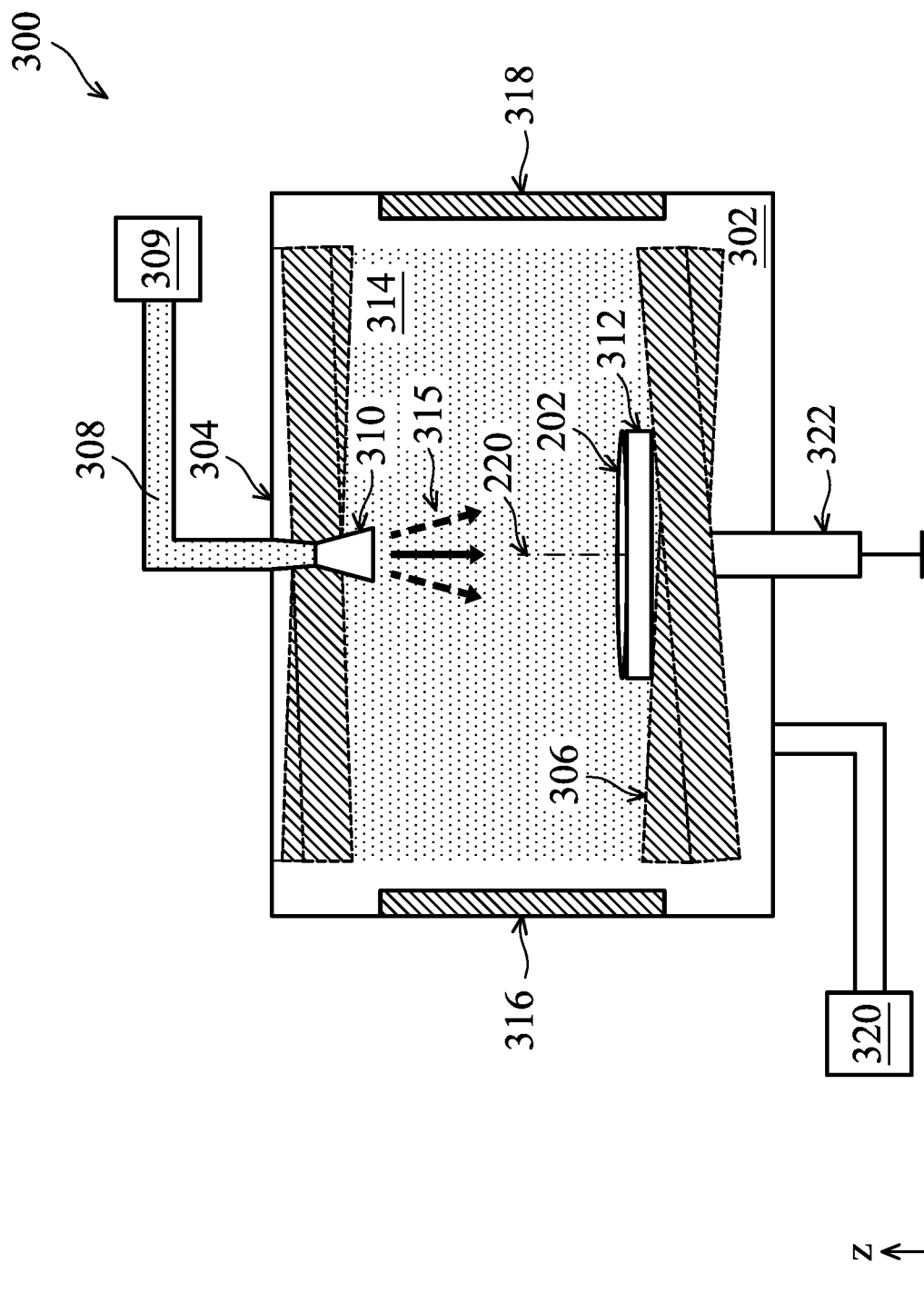
FIG. 5 is a schematic illustration of a fabrication apparatus according to some aspects of the present disclosure.

Referring to FIG. 1, at operation 102, the method 100 provides (or is provided with) the structure 200 (as shown in FIGS. 2A and 2B) in a deposition apparatus 300 (as shown in FIG. 5 and described in details below). The structure 200 includes a substrate 202 comprising a first surface 202a and one or more mandrels 204 formed on the first surface 202a. In many embodiments, the substrate 202 is a semiconductor substrate (e.g., a semiconductor wafer). In some embodiments, the substrate 202 includes silicon in a crystalline structure. Alternatively, the substrate 202 includes other elementary semiconductors such as germanium; or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices (e.g., planar transistors or multi-gate transistors such as FinFETs) or portions thereof, include conductive and/or non-conductive layers, and/or include other suitable features and layers. The first surface 202a may be planar or may include various structures having a high aspect ratio, such as semiconductor fins and/or gate structures. In the present embodiment, the first surface 202a is defined by a normal 220 configured to be substantially perpendicular to the first surface 202a. In some embodiments, there may be layers (e.g., dielectric layers, metal layers, etc.; not shown) between the substrate 202 and the mandrels 204.

In some embodiments, the mandrels 204 may be spacers formed adjacent to other features, such as semiconductor fins and/or gate structures. In other embodiments, the mandrels 204 are any raised features formed on the substrate 202. In many examples, the mandrels 204 may be used in a double-patterning, quadruple-patterning, or other multiple-patterning processes to form more than one shape from each mandrel 204. Though depicted to be parallel and oriented lengthwise in a y-direction (FIG. 2B), configuration of the mandrels 204 is not limited herein. In some embodiments, the mandrels 204 may include one or more dielectric layers having silicon (Si), titanium nitride (TiN), titanium oxide ($TiO_x$), tin oxide ($SnO_x$), silicon nitride (SiN), silicon oxide ($SiO_2$), silicon carbide (SiC), silicon carbide nitride (SiCN), silicon oxynitride (SiON), silicon oxycarbide (SiOC), silicon oxycarbonitride (SiOCN), a low-k dielectric material, other materials, or a combination thereof. The mandrels 204 may be formed by one or more methods including chemical oxidation, thermal oxidation, atomic layer deposition (ALD), chemical vapor deposition (CVD), and/or other suitable methods. In the present embodiment, each mandrel 204 comprises a top surface 204a, a first sidewall 204b, and a second sidewall 204c opposite to the first sidewall 204b when viewed in a side view (FIG. 2A).

The deposition apparatus 300 is configured to implement a vapor-based deposition process to the substrate 202 and the mandrels 204 formed thereon. In some embodiments, the deposition apparatus 300 is operable to implement a CVD process, a plasma-enhanced CVD (PECVD) process, a physical vapor deposition (PVD) process, or other suitable processes. In the depicted embodiment, the deposition apparatus 300 is configured to implement a PECVD process.

Referring to FIG. 5, the deposition apparatus 300 includes a chamber 302 in which the deposition process is implemented. The chamber 302 includes two parallel electrodes: a top electrode 304 and a bottom electrode 306. In an embodiment, the top electrode 304 is driven by a radio frequency (RF) power source while the bottom electrode 306 is grounded via a support structure 322. In the present embodiment, the top electrode 304 and the bottom electrode 306 are oppositely charged. A substrate stage 312 is configured to secure the substrate 202 thereon and may be an electrostatic chuck (e-chuck). In an embodiment, the substrate stage 312 is configured to heat the substrate 202 to an elevated temperature (e.g., between about 250 degrees Celsius to about 350 degrees Celsius). The chamber 302 receives a reactant material 308 from a gas supply 309 through a dispensing unit 310 configured to tilt with respect to the normal 220 of the substrate 202. In many embodiments, the reactant material 308 is a precursor gas suitable for a vapor-based deposition process. The reactant material 308 may include one of silane (SiH4), oxygen (O2), tetraethylorthosilicate (TEOS), ammonia ($NH_3$), nitrous oxide ($N_2O$), other suitable materials, or combinations thereof. The chamber 302 may further include a pumping unit 320 for removing any byproduct of the chemical reaction of the PECVD process. In the present embodiment, the chamber 302 also includes components 316 and 318 operable to generate electric field and/or magnetic field across the first surface 202a of the substrate 202. The deposition apparatus 300 may include other suitable components.

At operation 104, the method 100 forms plasma 314 in the deposition apparatus 300. Still referring to FIG. 5, the plasma 314 may be generated in the following manner. As the reactant material 308 enters the chamber 302 through the dispensing unit 310, the top electrode 304 ionizes the reactant material 308 to form the plasma 314, during which a chemical reaction occurs. Due to the charged bottom electrode 306, the charged plasma 314 accelerates downwards in a direction 315 and product of the chemical reaction (e.g., the deposition material 206 discussed below) are deposited onto the substrate 202 (or material layers formed thereon).

At operation 106, the method 100 deposits a layer of the deposition material 206 towards the mandrels 204. In the present embodiment, the deposition material 206 is different from the material of the mandrels 204. The deposition material 206 may be, for example, silicon (Si), titanium nitride (TiN), titanium oxide ($TiO_x$), tin oxide ($SnO_x$), silicon nitride (SiN), silicon oxide ($SiO_2$), silicon carbide (SiC), silicon carbide nitride (SiCN), silicon oxynitride (SiON), silicon oxycarbide (SiOC), silicon oxycarbonitride (SiOCN), a low-k dielectric material, other materials, or a combination thereof.

Under some operating conditions, the direction 315 of the plasma 314 is substantially parallel to the normal 220 of the first surface 202a of the substrate 202, such that a substantially uniform layer of the deposition material 206 is deposited on the top surface 204a, the first sidewall 204b, and the second sidewall 204c of the mandrels 204, as well as on the substrate 202 not covered by the mandrels 204. However, in the present embodiment, the deposition process during the operation 106 only forms a layer of the deposition material 206 on one of the two sidewalls of the mandrels 204. In one example, as shown in FIG. 3A, the deposition material 206 forms a layer 206a on the top surface of each mandrel 204, a layer 206b along the first sidewall 204b of each mandrel 204 and having a thickness of 205, and a layer 206c adjacent to the layer 206b and partially covering a portion of the substrate 202 between the two mandrels 204. There is no deposition material 206 deposited on the second sidewall 204c of each mandrel 204 in this example. In another example, the deposition material 206 may be formed on the second sidewall 204c but not on the first sidewall 204b (e.g., FIG. 10B).

In the present embodiment, deposition on one but not both of the sidewalls of the mandrels 204 may be achieved by tilting the direction 315 of the plasma 314 away from the normal 220 of the first surface 202a, and/or tilting the substrate 202 such that the normal 220 of the first surface 202a is away from the direction 315 of the plasma 314, both of which will be discussed in detail below. The implementation of "tilting," as provided in the present disclosure, refers to tilting a component (e.g., the dispensing unit 310 or the substrate stage 312) in any direction allowable by the range of motion of that component. Irrespective of the direction of the tilting, deposition occurs on only one of the two sidewalls 204b and 204c. As such, angles (e.g., angle 324) described below denote the extent of tilting and does not limit the embodiments to a specific direction.

The operation 106 may be implemented by either or both of operations 106a and 106b as described below. At operation 106a, the deposition result shown in FIG. 3A may be achieved by tilting the direction 315 of the plasma 314 away from the normal 220 of the first surface 202a of the substrate 202. In one example, referring to FIGS. 6A and 6B, tilting the direction 315 of the plasma 314 includes tilting the source of the plasma 314. In many embodiments, tilting the source of the plasma 314 includes adjusting the position of the dispensing unit 310 such that the direction along which the reactant material 308 enters the chamber 302 forms an angle 324 with the normal 220 of the first surface 202a of the substrate 202. In another example, the direction 315 of the plasma 314 may be changed by tilting one or both of the top electrode 304 and the bottom electrode 306. For example, as shown in FIG. 5, the top electrode 304 and/or the bottom electrode 306 may be tilted about the X, Y, or Z direction. In yet another example, the direction 315 of the plasma 314 may be changed by adjusting the strength of electric/magnetic field provided by the components 316 and/or 318. In many embodiments, the angle 324 is greater than about 0 degrees but less than about 90 degrees. In many embodiments, the angle 324 is determined based on factors such as height and pitch (i.e., separation distance between two adjacent mandrels 204) of the mandrels 204. For example, the range of angle 324 may be more restricted for mandrels 204 having relatively smaller pitch and/or greater height. The result of such implementation is selective deposition of the deposition material 206 on one of the two sidewalls of the mandrels 204 as described above with reference to FIG. 3A.

In another example, referring to FIGS. 9A-10B, the operation 106a may be implemented by applying an electric field or a magnetic field between the components 316 and 318 across the substrate 202 such that the plasma 314 accelerates towards the substrate 202 in a direction 315 determined by the respective polarity of the components 316 and 318. In the present embodiment, the plasma 314 is attracted to the component (316 or 318) that is oppositely charged, and the magnitude of the angle 324 can be determined by the strength of such attraction. FIGS. 9A and 10A illustrate two exemplary embodiments in which when the polarity of the components 316 and 318 is switched, the deposition material 206 forms on opposite sidewalls (e.g., the first sidewall 204b in FIG. 9B and the second sidewall 204c in FIG. 10B) of the mandrels 204.

Alternatively or additionally, at operation 106b, the deposition result shown in FIG. 3A may be achieved by tilting the substrate 202 such that the normal 220 of the first surface 202a is away from the direction 315 of the plasma 314. In an exemplary embodiment, referring to FIGS. 7A and 7B, the substrate 202 is tilted such that the normal 220 is tilted away from the direction 315 of the plasma 314 by the angle 324. Similar to the discussion above with respect to the operation 106a, the angle 324 is greater than about 0 degrees but less than about 90 degrees. In another example, referring to FIGS. 8A and 8B, both the source of the plasma 314 and the substrate 202 are tilted respectively such that the deposition material 206 is deposited on the first sidewall 204b to form the layer 206b. This may increase the range of the angle 324 compared with tilting either the plasma 314 or the substrate 202 alone. In yet another example, referring to FIGS. 11A and 11B, applying an electric or magnetic field across the substrate 202 may be implemented simultaneously as tilting the substrate 202. In many embodiments, the thickness 205 of the layer of the deposition material 206 on one of the two sidewalls 204b and 204c varies as a function of the angle 324. For example, comparing FIG. 8B to FIG. 6B, as the angle 324 increases, the thickness 205 of the layer 206b increases.

At operation 108, the method 100 removes portions of the deposition material 206 deposited on the mandrels 204 (FIGS. 4A and 4B). In the present embodiment, the layers 206a and 206c as shown in FIG. 3A are anistropically etched back by a suitable etching process, such as a dry etching process, thereby leaving behind the mandrels 204 and the deposited layer 206b. An exemplary dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

In some embodiments, the method 100 may include additional operations subsequent to the operation 108. For example, the method 100 may implement an operation 110 (FIG. 1) to remove the mandrels 204 to form a pattern comprising the layer 206b (not shown). The mandrels 204 may be removed by dry etching, wet etching, reactive ion etching (RIE), and/or other suitable processes. Thereafter, at operation 112, the method 100 may further include transferring the pattern comprising the layer 206b to the substrate 202, as depicted and discussed below. Accordingly, a dimension of the pattern formed on the substrate 202 is substantially equivalent to the thickness 205 of the layer 206b.

Figure 12:
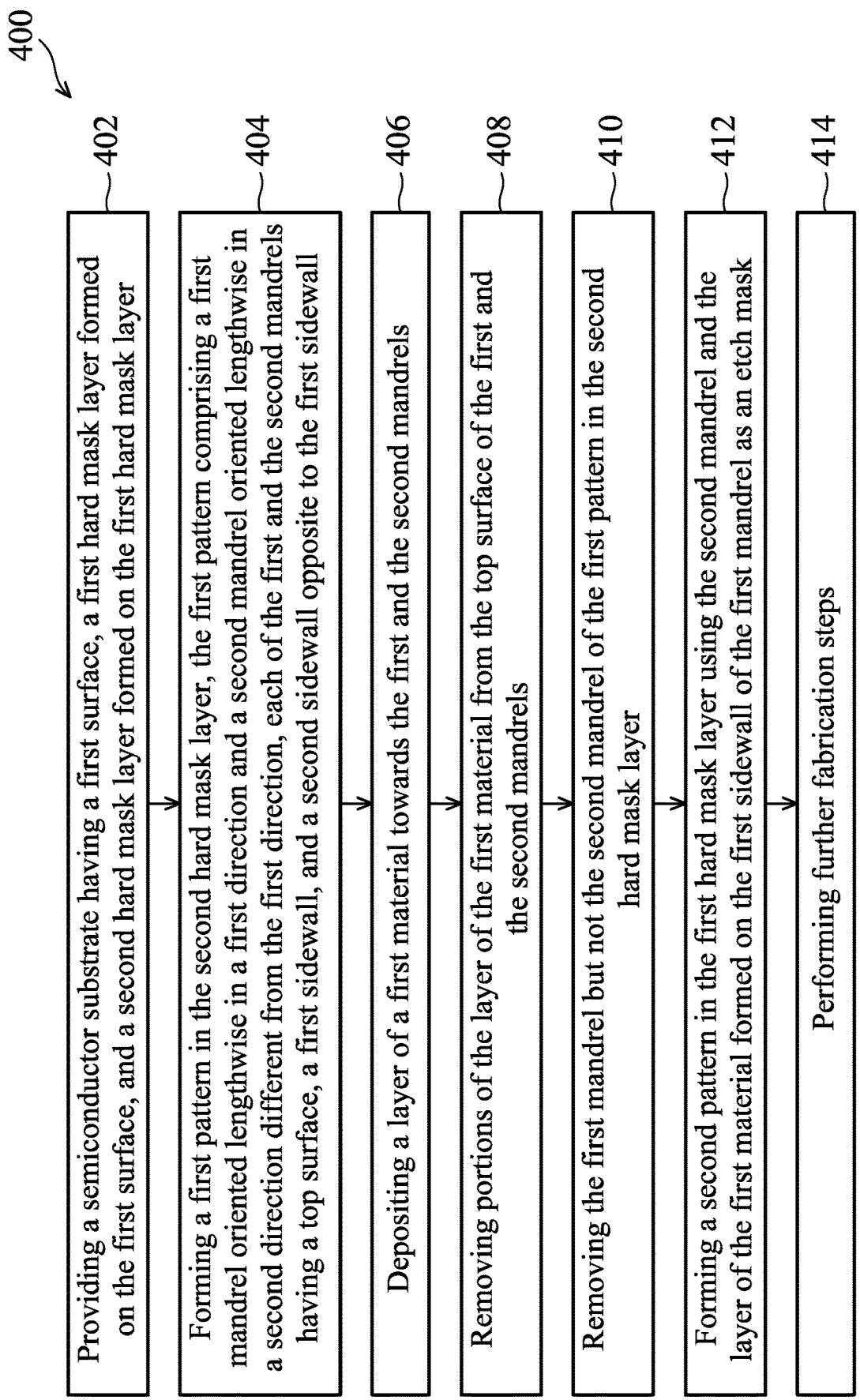
FIG. 12 is a flow chart of a method of forming a semiconductor device according to various aspects of the present disclosure.

FIG. 12 shows a flow chart of a method 400 for forming a semiconductor structure (or device) semiconductor structure 500 in one or more embodiments, according to various aspects of the present disclosure. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. Intermediate stages of the method 400 are described below in conjunction with FIGS. 13A-18D. Of which, FIGS. 13A, 14A, 15A, 16A, 17A, and 18A are perspective views of the semiconductor structure 500, FIGS. 13B, 14B, 15B, 16B, 17B, and 18B are top views of the semiconductor structure 500 (in a plane defined by directions 503 and 505), FIGS. 13C, 14C, 15C, 16C, 17C, and 18C are cross-sectional views of the semiconductor structure 500 taken along the line CC', and FIGS. 13D, 14D, 15D, 16D, 17D, and 18D are cross-sectional views of the semiconductor structure 500 taken along the line DD' during intermediate stages of fabrication according to some embodiments of the method 400. Cross-sectional views of the semiconductor structure 500 taken along directions CC' and DD' aim to illustrate sidewalls of a portion of the semiconductor structure 500 at various stages of the method 400 exemplified in the present disclosure. Portions of these cross-sectional views within the dotted borders help differentiate various layers, components, and regions of the semiconductor structure 500.

Figure 13C:
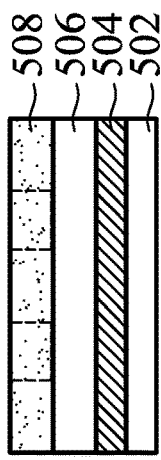
Figure 13D:
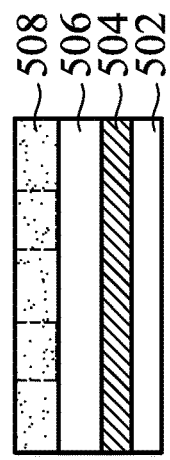
Figure 13B:
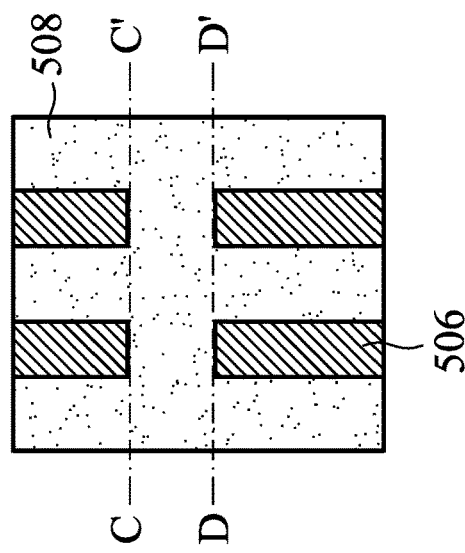
Figure 13A:
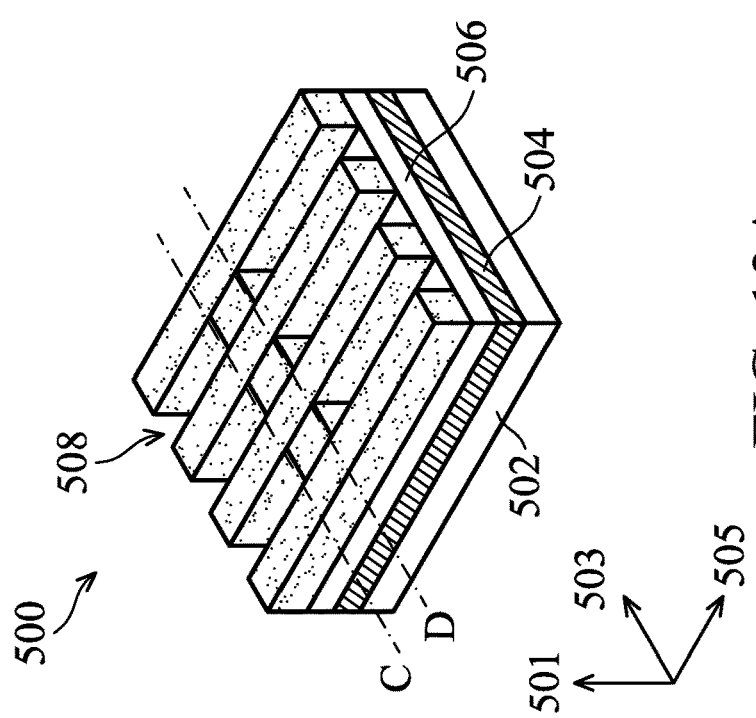

At operation 402, the method 400 provides (or is provided with) a substrate 502 having a first surface 514 (as shown in FIG. 18A), a first hard mask layer 504 formed on the first surface 514, and a second hard mask layer 506 formed on the first hard mask layer 504 (FIGS. 13A-13D). The semiconductor structure 500 has a normal 501 perpendicular to the plane defined by a first direction 503 and a second direction 505 as illustrated in FIG. 13A. The substrate 502 is similar to the substrate 202 described with respect to the method 100 and may be, for example, a semiconductor substrate (e.g., a semiconductor wafer). In some embodiments, the substrate 502 includes silicon in a crystalline structure. Alternatively, the substrate 502 includes other elementary semiconductors such as germanium; or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 502 may include a silicon on insulator (SOI) substrate, be strained/stressed for performance enhancement, include epitaxial regions, include isolation regions, include doped regions, include one or more semiconductor devices (e.g., planar transistors or multi-gate transistors such as FinFETs) or portions thereof, include conductive and/or non-conductive layers, and/or include other suitable features and layers. The first surface 514 may be planar or non-planar, which may be a top surface of various structures having a high aspect ratio, such as semiconductor fins and/or gate structures.

In many embodiments, the first hard mask layer 504 and the second hard mask layer 506 may comprise any suitable material, such as silicon oxide, silicon nitride, silicon carbide, silicon oxycarbide, or silicon oxynitride. The first hard mask layer 504 and the second hard mask layer 506 may be formed by a suitable method, such as thermal oxidation, CVD, high-density plasma CVD (HDP-CVD), flowable CVD, PVD, ALD, other suitable methods, or a combination thereof. In the present embodiment, the first hard mask layer 504 and the second hard mask layer 506 comprise dissimilar materials.

At operation 404, the method 400 forms a first pattern 510 in the second hard mask layer 506 (FIGS. 13A-14D). The first pattern 510 may be formed on the second hard mask layer 506 by any suitable method. In one example, the first pattern 510 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. In one example, a photoresist layer is first applied over the second hard mask layer 506, and is patterned using one or more photolithography processes including resist exposing and developing to form a patterned resist (e.g., photoresist) layer 508 (FIGS. 13A-13D). The second hard mask layer 506 is then etched using the patterned resist layer 508 as an etch mask, thereby forming the first pattern 510 in the second hard mask layer 506 (FIGS. 14A-14D). Thereafter, the patterned resist layer 508 is removed by any suitable method, such as plasma ashing or resist stripping.

In the depicted embodiment (FIGS. 14A and 14B), the first pattern 510 includes a first mandrel 510a substantially oriented lengthwise in the first direction 503 and second mandrel 510b substantially oriented lengthwise in the second direction 505. Though depicted to be perpendicular to one another in the present disclosure, the first mandrel 510a and the second mandrel 510b are not limited to this configuration and may be substantially oriented in any two dissimilar directions. The first pattern 510 may further include other components suitable for IC fabrication processes.

Figure 14C:
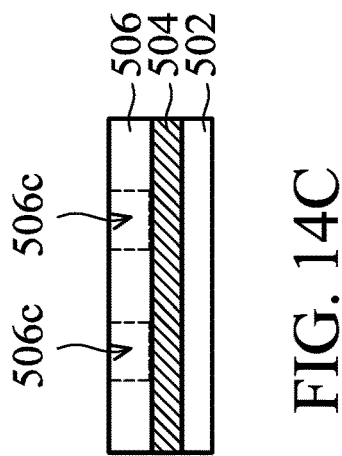
Figure 14D:
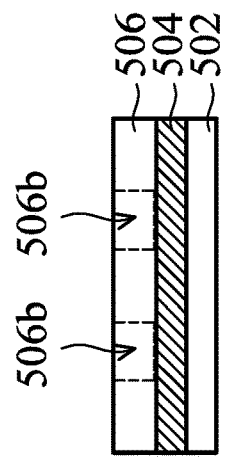
Figure 14B:
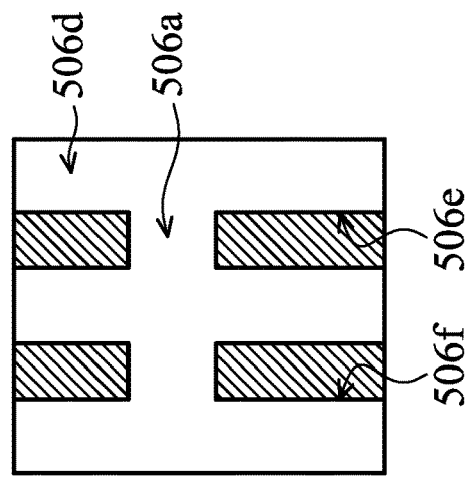
Figure 14A:
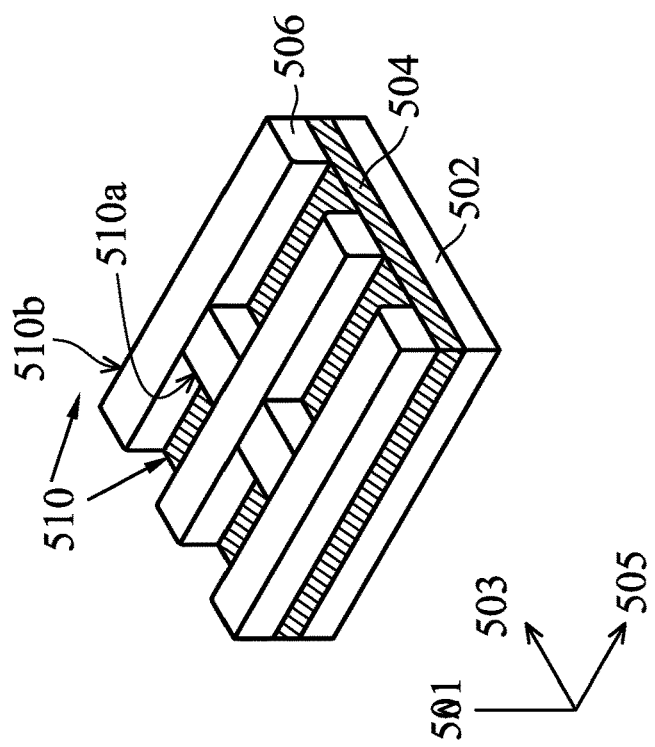

In some embodiments, the first mandrel 510a and the second mandrel 510b may be configured to form spacers adjacent to other features, such as semiconductor fins and/or gate structures. In some embodiments, the first mandrel 510a and the second mandrel 510b may be any raised features formed on the substrate 502 or material layers (e.g., the first and the second hard mask layers 504 and 506) formed thereon. In some embodiments, the second hard mask layer 506 may include one or more dielectric layers having silicon (Si), titanium nitride (TiN), titanium oxide (TiO$_x$), tin oxide (SnO$_x$), silicon nitride (SiN), silicon oxide (SiO$_2$), silicon carbide (SiC), silicon carbide nitride (SiCN), silicon oxynitride (SiON), silicon oxycarbide (SiOC), silicon oxycarbonitride (SiOCN), a low-k dielectric material, other materials, or a combination thereof. In the present embodiment, the first mandrel 510a has a top surface 506a (FIG. 14B), a first sidewall 506b (FIG. 14D), and a second sidewall 506c opposite to the first sidewall 506b (FIG. 14C), while the second mandrel 510b has a top surface 506d (FIG. 14B), a first sidewall 506e (FIG. 14B), and a second sidewall 506f opposite to the first sidewall 506e (FIG. 14B).

At operation 406, referring to FIGS. 15A-15D, the method 400 deposits a material 512 on the first mandrel 510a and the second mandrel 510b. In the present embodiment, the material 512 has a composition different from that of the second hard mask layer 506. The material 512 may include silicon (Si), titanium nitride (TiN), titanium oxide (TiO$_x$), tin oxide (SnO$_x$), silicon nitride (SiN), silicon oxide (SiO$_2$), silicon carbide (SiC), silicon carbide nitride (SiCN), silicon oxynitride (SiON), silicon oxycarbide (SiOC), silicon oxycarbonitride (SiOCN), a low-k dielectric material, other materials, or a combination thereof (Will update based on inventor's feedback). In some embodiments, the material 512 is magnetic, such that it may respond to changes in a magnetic field. In some embodiments, the material 512 carries electrical charges, such that it may respond to changes in an electrical field.

In the present embodiment, the method 400 deposits the material 512 by implementing a vapor-based deposition technique, such as PECVD, in a deposition apparatus (e.g., the deposition apparatus 300 of FIG. 5), similar to the operation 106 of the method 100. In an embodiment, the material 512 is deposited in the form of plasma (e.g., plasma 314) by first ionizing a reactant material (e.g., the reactant material 308), thereby inducing a chemical reaction to produce the material 512 which is then deposited towards the first mandrel 510a and the second mandrel 510b under the influence of two parallel and oppositely charged electrodes (e.g., the top electrode 304 and the bottom electrode 306 of FIG. 5).

Figures 15C, 15D:
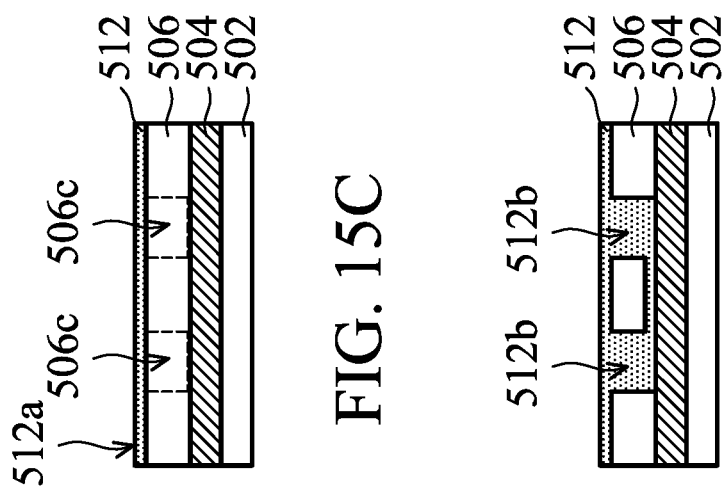
Figure 15B:
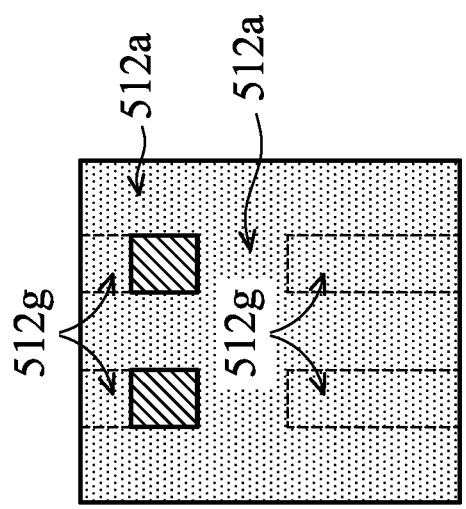
Figure 15A:
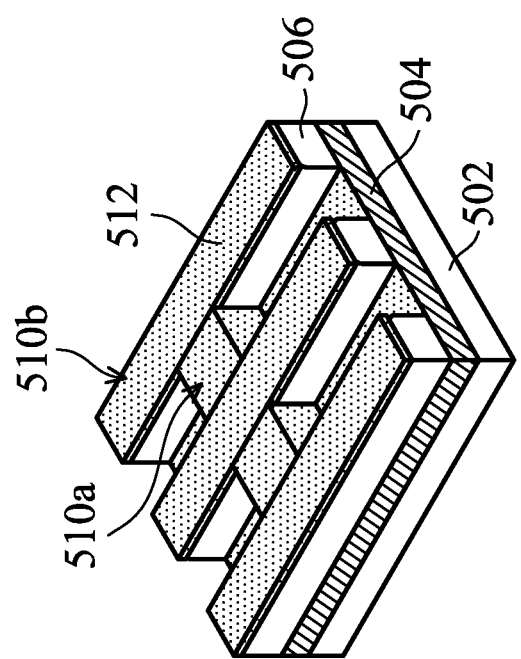
Figure 17D:
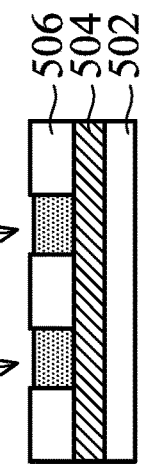
Figure 17C:
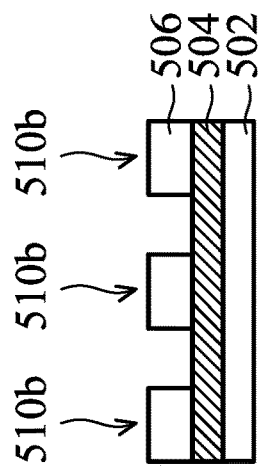
Figure 17B:
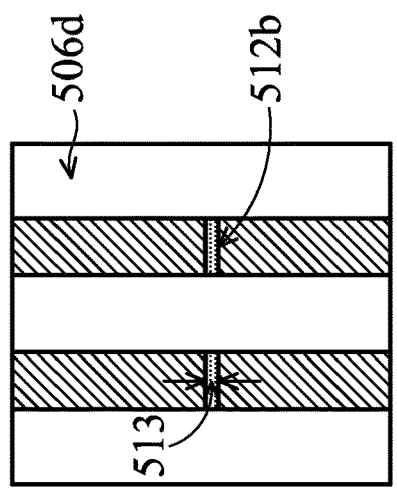
Figure 17A:
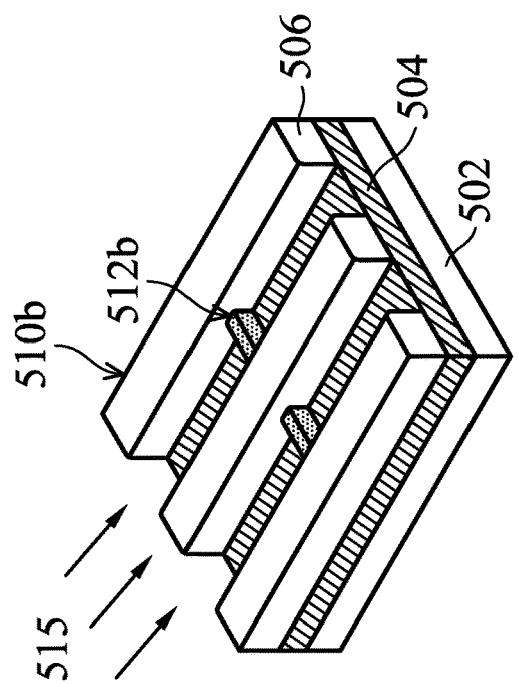

As illustrated in FIGS. 15A-15D, the method 400 deposits a layer 512a of the material 512 on the top surface 506a and a layer 512b on the first sidewall 506b of the first mandrel 510a (FIGS. 15A and 15D). Concurrently, the method 400 deposits the layer 512a on the top surface 506d of the second mandrel 510b (FIGS. 15A and 15B). Furthermore, the method 400 may deposit a layer 512g of the material 512 on a top surface of portions of the exposed first hard mask layer 504 (FIG. 15B). In the present embodiment, however, the method 400 does not deposit a layer of the material 512 on the second sidewall 506c of the first mandrel 510a (FIG. 15C), nor does it deposit a layer on the first sidewall 506e and the second sidewall 506f of the second mandrels 510b (FIG. 15B). In other words, the method 400 obliquely deposits the material 512 towards the first and the second mandrels 510a and 510b, such that the material 512 is only formed on one of the sidewalls of the first mandrel 510a (e.g., the first sidewall 506b) but not on the other (e.g., the second sidewall 506c).

The deposition results illustrated in FIGS. 15A-15D may be achieved by positioning the normal 501 of the first surface 514 (i.e., the top surface of the semiconductor structure 500) at an angle with a direction in which the material 512 is deposited towards the first mandrel 510a and the second mandrels 510b. In other words, the material 512 is obliquely deposited towards the first surface 514 at an angle relative to the normal 501. Similar to the discussion above with respect to the method 100, particularly the operations 106, 106a, and 106b, the operation 406 may be implemented by tilting the direction of the plasma (i.e., tilting a source of the plasma) away from the normal 501 of the first surface 514 and/or tilting the semiconductor structure 500 such that the normal 501 is away from the direction of the plasma. The implementation of "tilting," similar to the discussion above, refers to tilting a component (e.g., a dispensing unit of the plasma or a stage for holding the semiconductor structure 500 in the deposition apparatus) in any direction allowable by the range of motion of that component. Irrespective of the direction of tilting, deposition occurs only on a portion of the first and the second mandrels 510a and 510b, such as on one of the two sidewalls, 506b or 506c, of the first mandrel 510a, but not both.

Similar to the operation 106a (e.g., FIGS. 6A and 6B), the deposition result shown in FIGS. 15A-15D may be achieved by tilting the direction of the plasma away from the normal 501 of the first surface 514 of the substrate 502. In one example, tilting the direction of the plasma includes tilting the source of the plasma. In many embodiments, tilting the source of the plasma includes adjusting the position of the dispensing unit such that the direction along which the reactant material enters the chamber forms an angle with the normal 501 of the first surface 514 of the substrate 502. In many embodiments, the angle is greater than about 0 degrees but less than about 90 degrees. In another example (e.g., FIGS. 9A-10A), the deposition may be implemented by applying an electric field or a magnetic field across the semiconductor structure 500 such that the plasma (i.e., the material 512) accelerates towards the semiconductor structure 500 in a preferential direction determined by the respective polarity of components (e.g., components 316 and 318) generating the electric field or the magnetic field. In particular, the direction of the plasma is determined by the attraction between the plasma and the component that is oppositely charged, and the extent of tilting can be determined by the strength of such attraction. The result of such implementation is the deposition of the material 512 on one of the two sidewalls 506b or 506c; 506b is depicted herein for illustrative purposes only) of the first mandrel 510a and on the top surface 506d of the second mandrels 510b as described above.

Alternatively or additionally, similar to the operation 106b (e.g., FIGS. 7A and 7B), the deposition result shown in FIGS. 15A-15D may be achieved by tilting the semiconductor structure 500 such that the normal 501 of the first surface 514 is away from the direction of the plasma. In an exemplary embodiment, the semiconductor structure 500 is tilted such that the normal 501 is away from the direction of the plasma by the angle that is greater than about 0 degrees but less than about 90 degrees. Similar to the discussion above, the tilting can be implemented by tilting the semiconductor structure 500 in any direction allowable by the substrate stage (e.g., the substrate stage 312) on which it is secured. In another example, both the source of the plasma and the semiconductor structure 500 may be tilted respectively such that the material 512 is deposited on one of the two sidewalls (e.g., 506b and 506c) of the first mandrel 510a (e.g., FIGS. 8A and 8B). In yet another example, applying an electric or magnetic field across the semiconductor structure 500 may be implemented simultaneously as tilting the semiconductor structure 500 (e.g., FIGS. 11A and 11B).

At operation 408, the method 400 removes portions of the deposited material 512 from the first mandrel 510a and the second mandrels 510b (e.g., the layer 512a), respectively. As seen in FIGS. 16A-16D, only the layer 512b deposited on the first sidewall 506b of the first mandrel 510a remains following the implementation of the operation 408. The remaining layer 512b has a thickness of 513 as depicted in FIG. 16B. In an embodiment, portions of the material 512 deposited on the exposed surface of the first hard mask layer 504 (i.e., the layer 512g) may also be removed together with the layer 512a. The layers 512a and 512g may be removed by one or more anisotropic etching processes (e.g., dry etching), such that the layer 512b on the first sidewall 506b of the first mandrel 510a is not substantially etched. In one example, an exemplary dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In many embodiments, the anisotropic etching process has a higher etch selectivity for the material 512 than for the material(s) constituting the first mandrel 510a and the second mandrels 510b.

At operation 410, the method 400 removes the first mandrel 510a from the semiconductor structure 500 (FIGS. 17A-17D). In the depicted embodiment, the operation 410 removes the first mandrel 510a without substantially removing the second mandrels 510b by a directional etching process, such as a dry etching process, other suitable processes, or combinations thereof. In the present embodiment, the directional etching process may be the same or different from the etching process described with respect to the operation 408. In many embodiments, the directional etching process implements a higher etch selectivity for the material constituting the first mandrel 510a than for the material 512, which constitutes the layer 512b remaining on the first hard mask layer 504.

The directional etching process may be implemented by positioning the normal 501 of the semiconductor structure 500 at an angle with the direction in which an etchant of a suitable etching process is applied to the semiconductor structure 500. Specifically, the directional etching process may be accomplished by tilting the semiconductor structure 500 away from a source of the etchant, and/or tilting the source of the etchant away from the semiconductor structure 500. In the depicted embodiment, referring to FIG. 17A, the semiconductor structure 500 may be tilted or the source of the etchant may be tilted such that a direction 515 of etching is at an angle relative to the normal 501. In some embodiments, though a small portion (e.g., edges and/or corners) of the second mandrels 510b may be etched during the removal process, a substantial amount of the second mandrels 510b remains.

At operation 412, the method 400 forms a second pattern 520 in the first hard mask layer 504 using the second mandrels 510b and the layer 512b deposited on the first sidewall 506b of the first mandrel 510a as an etch mask (FIGS. 18A-18D). The operation 412 may be implemented by an etching process, such as dry etching, wet etching, RIE, and/or other suitable process as discussed in details above. Thereafter, the second mandrels 510b and the layer 512b are removed from the semiconductor structure 500 by any etching processes (e.g., wet etching, dry etching, RIE, etc.), forming the second pattern 520 on the first hard mask layer 504.

Figure 19:
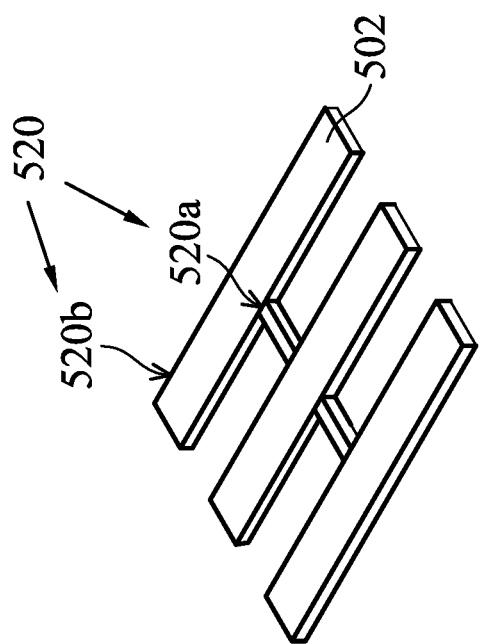

In the present embodiment, the second pattern 520 formed in the first hard mask layer 504 comprises a first component 520a, which is substantially similar to a configuration of the layer 512b, and a second component 520b, which is substantially similar to a configuration of the second mandrels 510b. As such, the smallest dimension of the second pattern 520 (i.e., thickness of the first component 520a) may be substantially the same as the thickness 513 of the layer 512b. In an exemplary embodiment, the smallest dimension of the second pattern 520 may be between about 5 nm and about 10 nm. Thereafter, at operation 414, the method 400 performs further fabrication steps including processing the substrate 502 using the second pattern 520 formed in the first hard mask layer 504 as a mask. In one example, referring to FIG. 19, the method 400 may etch the substrate 502 using the second pattern 520 formed in the first hard mask layer 504 as an etch mask and form IC components on the semiconductor structure 500, and the first hard mask layer 504 may be subsequently removed. In another example, the method 400 may perform an implantation process using the second pattern 520 as an implantation mask. Of course, the present disclosure is not limited to these processes and may include any suitable processes at operation 414.

Although not intended to be limiting, one or more embodiments of the present disclosure provide many benefits to a semiconductor device and a formation process thereof. For example, embodiments of the disclosed method can directly form spacers on one sidewall or surface of a structure (e.g., a mandrel) without needing to remove spacer material deposited on other sidewalls or surfaces, thereby reducing fabrication steps and fabrication complexity. Further, the smallest dimension of a pattern formed using the disclosed method combined with methods of directional etching may be a function of the thickness of the deposited material and may therefore be smaller than what can be accomplished by a lithography exposure system if the pattern were to be formed directly.

In one exemplary aspect, the present disclosure pertains to a method that includes providing a mandrel formed on a surface of a substrate, where the mandrel includes a first sidewall and a second sidewall opposite to the first sidewall, and depositing a material towards the first sidewall at an angle tilted from a normal of the first surface, resulting in a layer of the first material on the first sidewall but not on the second sidewall.

In an embodiment, depositing of the material includes tilting a source of the material, tilting the substrate, applying an electric field, or applying a magnetic field. In a further embodiment, depositing of the material includes simultaneously tilting the source and tilting the substrate. In yet another embodiment, the electric field and the magnetic field are established across the surface of the substrate.

In one embodiment, depositing of the material further includes depositing the material on a top surface of the mandrel.

In one embodiment, depositing of the first material is implemented by a plasma-enhanced chemical vapor deposition (PECVD) technique.

In another embodiment, subsequent to depositing the first material towards the first sidewall, the method further includes removing the mandrel from the surface of the substrate, resulting in a pattern comprising the first material, and processing the substrate using at least the pattern as a mask.

In another exemplary aspect, the present disclosure pertains to a method that includes providing a substrate in a deposition apparatus, the substrate having a surface with a mandrel formed thereon, forming plasma of a first material in the deposition apparatus, and obliquely depositing a layer of the first material towards the mandrel relative to a normal of the first surface using the plasma.

In one embodiment, the obliquely depositing the layer includes tilting a direction of the plasma from the normal of the first surface.

In a further embodiment, the tilting the direction of the plasma from the normal of the surface is implemented by establishing an electric field across the substrate.

In a still further embodiment, the tilting the direction of the plasma from the normal of the surface is implemented by tilting a source of the plasma.

In yet another embodiment where the first material is magnetic, the tilting the direction of the plasma from the normal of the surface is implemented by establishing a magnetic field across the substrate.

In another embodiment, the mandrel includes a second material different from the first material, and the method further includes selectively removing the mandrel to form a pattern, such that the pattern includes the first material, and processing the substrate using at least the pattern as a mask.

In yet another embodiment, depositing the layer of the first material towards the mandrel forms the layer of the first material on a first sidewall but not on a second sidewall opposite to the first sidewall of the mandrel.

In yet another exemplary aspect, the present disclosure pertains to a method that includes providing a substrate having a surface such that a first hard mask layer is formed over the surface and a second hard mask layer is formed over the first hard mask layer, forming a first pattern in the second hard mask layer, where the first pattern includes a first mandrel oriented lengthwise in a first direction and a second mandrel oriented lengthwise in a second direction different from the first direction, and where the first mandrel has a top surface, a first sidewall, and a second sidewall opposite to the first sidewall, and depositing a material towards the first mandrel and the second mandrel such that a layer of the material is formed on the top surface and the first sidewall but not the second sidewall of the first mandrel.

In one embodiment, depositing the material includes depositing the material in a form of plasma. In a further embodiment, depositing the first material is implemented by tilting the substrate, tilting a source of the first material, applying an electric field across the substrate, or applying a magnetic field across the substrate.

In one embodiment, composition of the deposited material is different from that of the second hard mask layer. In a further embodiment, subsequent to the depositing of the material, the method further includes removing portions of the layer of the material from the top surface of the first mandrel. In yet another embodiment, the method further includes removing the first mandrel but not the second mandrel, followed by forming a second pattern in the first hard mask layer using the second mandrel and the layer of the material formed on the first sidewall of the first mandrel as an etch mask.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a mandrel formed on a top surface of a substrate, wherein the mandrel comprises a top surface, a first sidewall, and a second sidewall opposite to the first sidewall;
   tilting a dispensing unit configured to supply a material towards the substrate away from a normal axis of the top surface of the substrate;
   dispensing the material from the tilted dispensing unit;
   depositing the material towards the first sidewall of the mandrel, resulting in a first layer of the material on the first sidewall but not on the second sidewall of the mandrel, a second layer of the material on the top surface of the mandrel, and a third layer of the material on the top surface of the substrate extending away from the first layer;
   removing the third layer from the top surface of the substrate, wherein removing the third layer removes the second layer from the top surface of the mandrel, resulting in a pattern that includes the mandrel and the first layer of the material remaining on the first sidewall of the mandrel; and
   selectively removing the mandrel with respect to the first layer of the material, resulting in the pattern to include the first layer of the material, wherein the pattern is free of the mandrel, the second layer of the material, and the third layer of the material.

2. The method of claim 1, wherein the substrate is disposed between a top electrode and a bottom electrode with the top surface of the substrate facing the top electrode, and wherein depositing the material further includes applying an electric field between the top electrode and the bottom electrode.

3. The method of claim 1, wherein depositing the material includes simultaneously tilting the dispensing unit and tilting the substrate.

4. The method of claim 1, further comprising:
   subsequent to selectively removing the mandrel,
   processing the substrate using at least the pattern as a mask.

5. A method, comprising:
   providing a deposition apparatus including a substrate stage, a dispensing unit, a top electrode disposed above the substrate stage, and a bottom electrode disposed below the substrate stage, wherein the dispensing unit extends to below the top electrode;
   providing a substrate on the substrate stage, wherein the substrate includes a top surface having a mandrel formed thereon;
   forming plasma of a first material dispensed from the dispensing unit;
   applying an electric field between the top electrode and the bottom electrode, thereby tilting a direction of the plasma away from a normal of the top surface of the substrate;
   obliquely depositing the first material towards the mandrel relative to the normal of the top surface using the tilted plasma, resulting in one of two opposing sidewalls of the mandrel being covered with a first layer of the first material but the other one of the two opposing sidewalls of the mandrel being free of any of the first material, and the top surface of the substrate being covered with a second layer of the first material adjacent to the first layer;
   obliquely etching to remove the second layer of the first material with respect to the first layer of the first material and the mandrel;
   performing an etching process to remove the mandrel, resulting in a structure including the first layer of the first material but free of the mandrel and the second layer of the first material; and
   processing the substrate using the structure as a mask.

6. The method of claim 5, wherein obliquely depositing the first material further includes tilting the substrate stage away from the normal of the top surface of the substrate.

7. The method of claim 5, wherein obliquely depositing the first material further includes tilting the dispensing unit away from the normal of the top surface of the substrate.

8. The method of claim 5, wherein the deposition apparatus further includes a first magnetic component and a second magnetic component, such that the substrate stage is laterally disposed between the first magnetic component and the second magnetic component, and wherein oblique depositing the first material further includes establishing a magnetic field between the first magnetic component and the second magnetic component, thereby tilting the direction of the plasma away from the normal of the top surface of the substrate.

9. The method of claim 5, wherein the mandrel includes a second material different form the first material, such that performing the etching process selectively removes the mandrel without removing the first layer of the first material.

10. The method of claim 5, wherein depositing the first material towards the mandrel forms a third layer of the first material on a top surface of the mandrel, and wherein obliquely etching to remove the second layer of the first material removes the third layer of the first material.

11. A method, comprising:
providing a deposition chamber including a sample stage configured to retain a semiconductor substrate, a dispensing unit configured to deposit a material toward the semiconductor substrate, a top electrode configured to ionize the material to form a plasma, and a bottom electrode disposed opposite to the top electrode, such that the semiconductor substrate is disposed between the top electrode and the bottom electrode;
providing the semiconductor substrate retained on the sample stage, the semiconductor substrate having a mandrel disposed thereon, wherein the mandrel includes a top surface disposed opposite to a top surface of the semiconductor substrate, a first sidewall surface, and a second sidewall surface;
tilting the dispensing unit with respect to a normal of the top surface of the semiconductor substrate;
dispensing the material from the tilted dispensing unit, wherein the dispensed material is ionized by the top electrode to form the plasma;
depositing the plasma over the semiconductor substrate, resulting in a first portion of the material formed on the first sidewall surface but not the second sidewall surface of the mandrel, a second portion of the material formed on the top surface of the mandrel, and a third portion of the material formed on the top surface of the semiconductor substrate adjacent to the first portion;
performing a first etching process to selectively remove the second and the third portions of the material with respect to the first portion of the material, such that the semiconductor substrate includes the mandrel and the first portion of the material formed on the first sidewall surface but not on the second sidewall surface; and
performing a second etching process to selectively remove the mandrel with respect to the first portion of the material.

12. The method of claim 11, wherein depositing the material includes tilting the sample stage with respect to the normal of the top surface of the semiconductor substrate.

13. The method of claim 11, wherein depositing the material includes applying an electric field between the top electrode and the bottom electrode, thereby tilting a direction of the plasma with respect to the normal of the top surface of the mandrel.

14. The method of claim 11, wherein the deposition chamber further includes a first side component and a second side component, such that the semiconductor substrate is disposed laterally between the first side component and the second side component, and wherein depositing the plasma includes applying a magnetic field between the first side component and the second side component, thereby tilting a direction of the plasma with respect to the normal of the top surface of the mandrel.

15. The method of claim 13, wherein depositing the material includes simultaneously applying the electric field and tilting the sample stage away from the normal of the top surface of the mandrel.

16. The method of claim 1, wherein the substrate is laterally disposed between a first electromagnetic plate and a second electromagnetic plate, and wherein depositing the material further includes applying an electric field, applying a magnetic field, or a combination thereof between the first electromagnetic plate and the second electromagnetic plate.

17. The method of claim 2, wherein depositing the material includes simultaneously applying the electric field and tilting the substrate.

18. The method of claim 7, wherein obliquely depositing the first material further includes simultaneously tilting the substrate stage and the dispensing unit away from the normal of the top surface of the substrate.

19. The method of claim 14, wherein depositing the plasma includes applying an electric field between the first side component and the second side component, thereby tilting a direction of the plasma with respect to the normal of the top surface of the mandrel.

20. The method of claim 11, further comprising processing the semiconductor substrate using remaining first portion of the material as a mask.

* * * * *